United States Patent [19]
Markoya et al.

[11] Patent Number: 5,966,215
[45] Date of Patent: Oct. 12, 1999

[54] LINE WIDTH INSENSITIVE WAFER TARGET DETECTION IN TWO DIRECTIONS

[75] Inventors: Louis Markoya, Shelton; Joseph Lyons, Wilton, both of Conn.

[73] Assignee: SVG Lithography Systems, Inc., Wilton, Conn.

[21] Appl. No.: 09/290,217

[22] Filed: Apr. 13, 1999

Related U.S. Application Data

[62] Division of application No. 08/730,787, Oct. 16, 1996.

[51] Int. Cl.⁶ .................................................. G01N 11/00
[52] U.S. Cl. ......................... 356/400; 356/401; 250/548
[58] Field of Search ................................... 356/399, 400, 356/401; 250/548

[56] References Cited

U.S. PATENT DOCUMENTS

| | | |
|---|---|---|
| 4,697,087 | 9/1987 | Wu . |
| 4,719,357 | 1/1988 | Ayata et al. . |
| 4,769,680 | 9/1988 | Resor, III et al. . |
| 4,871,257 | 10/1989 | Suzuki et al. . |
| 5,477,057 | 12/1995 | Angeley et al. . |

*Primary Examiner*—Robert H. Kim
*Attorney, Agent, or Firm*—Fattibene & Fattibene; Paul A. Fattibene; Arthur T. Fattibene

[57] ABSTRACT

An alignment system for use in semiconductor manufacturing that matches pairs of like edges of alignment marks. Grating type alignment marks are illuminated by a predetermined illumination pattern with the reflected and/or scattered electromagnetic radiation collected by a detector. Like edges are selected from the collected electromagnetic radiation and matched. A signal analyzer analyses the matched like edges and obtains alignment information. The matching of like edges results in relatively process insensitive detection of wafer alignment marks. The distance between like edges is substantially less effected by wafer processing. Wafer alignment marks can thereby be more accurately detected, resulting in improved positioning and alignment accuracies. This improves and advances the technology use to manufacture semiconductor devices.

12 Claims, 5 Drawing Sheets

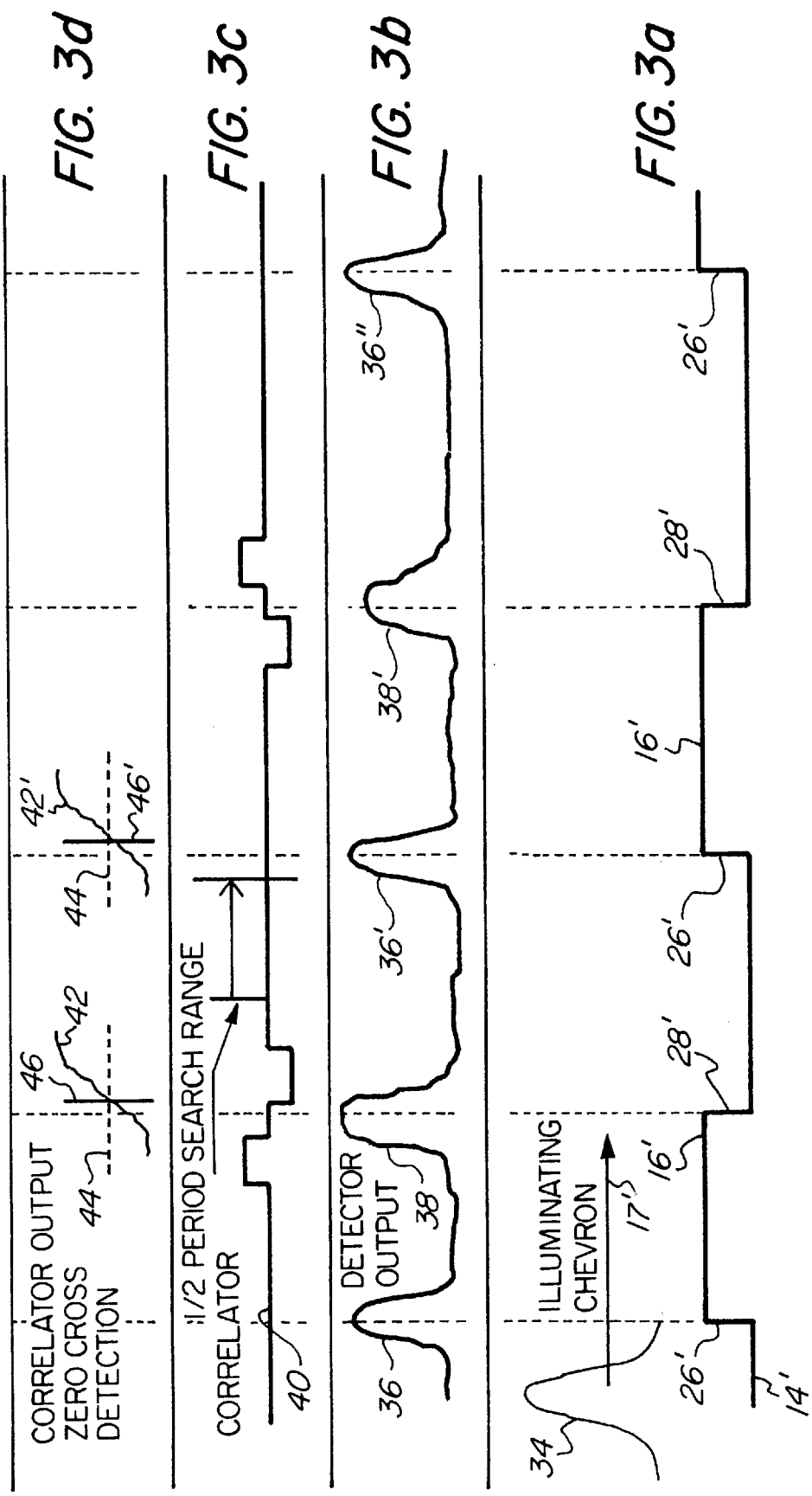

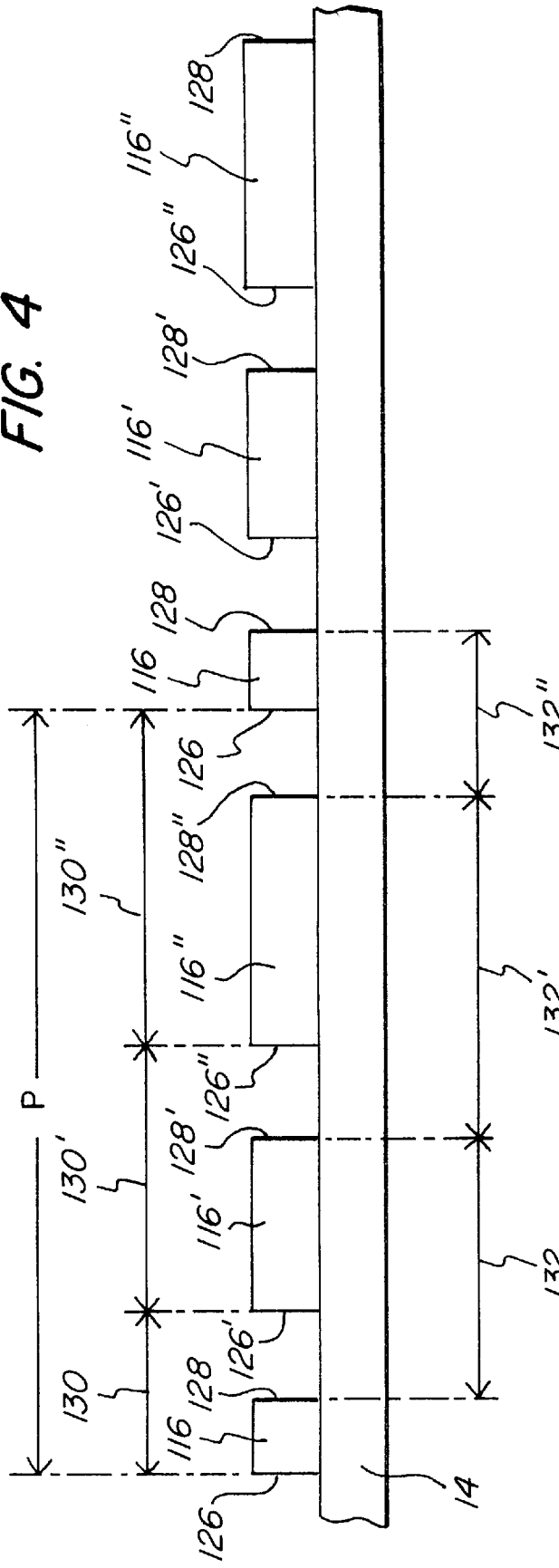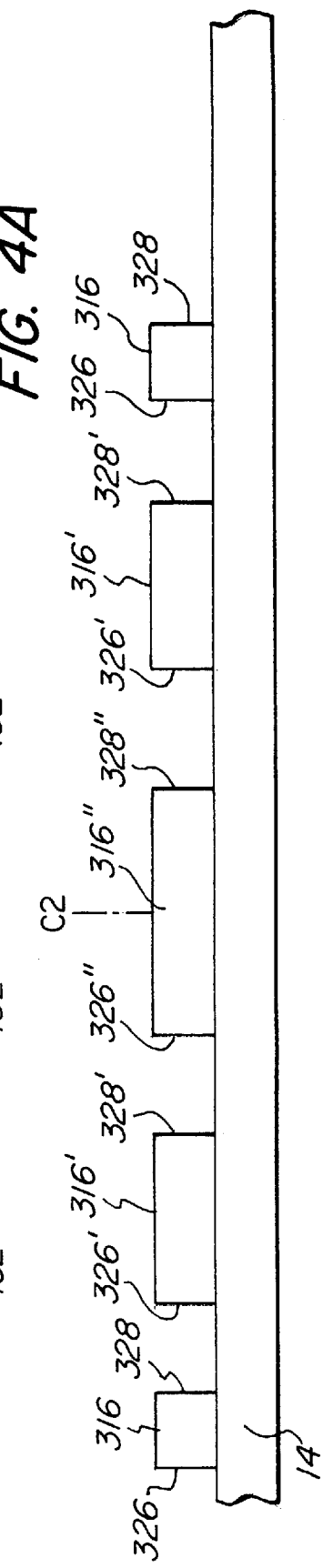

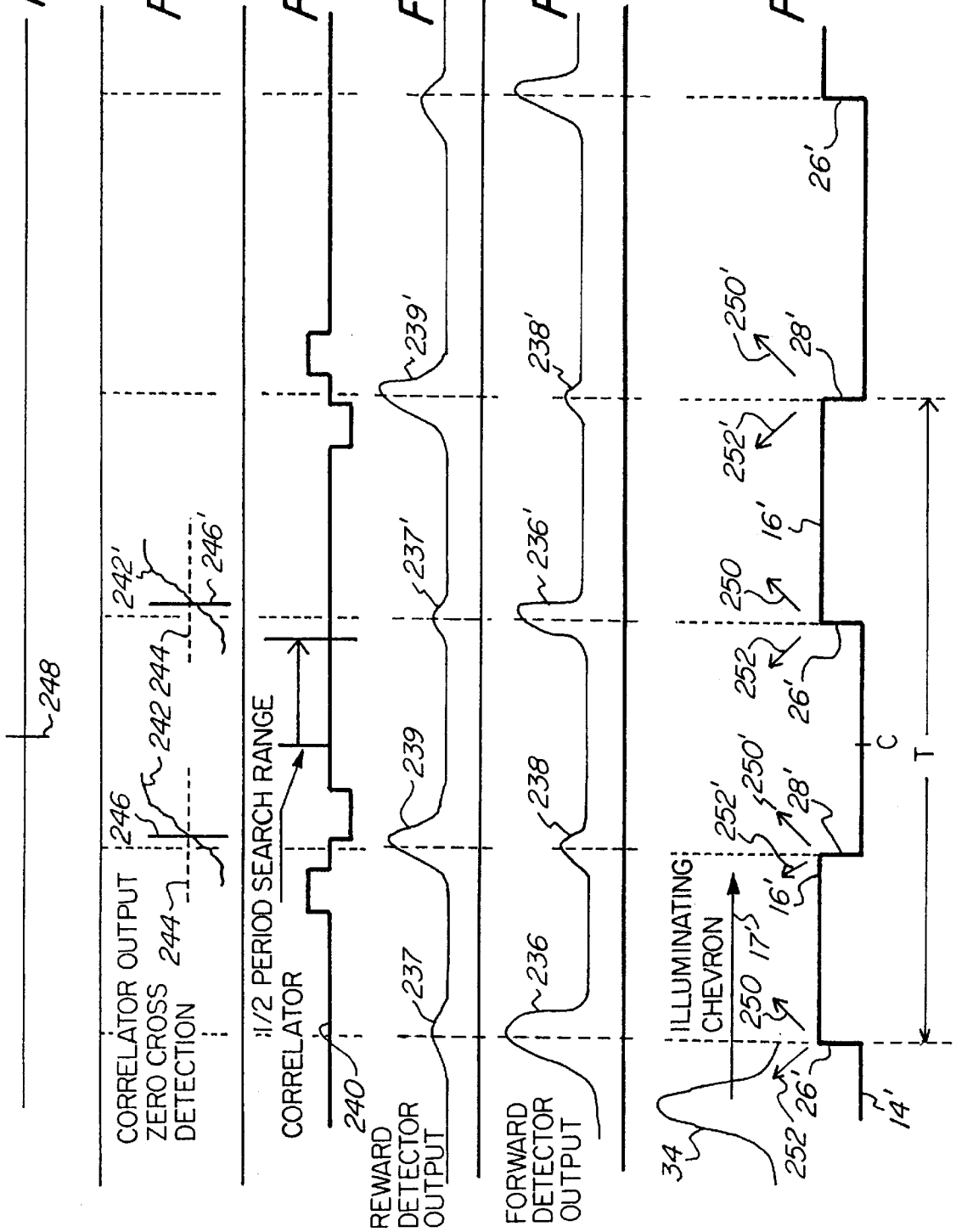

LINE WIDTH INSENSITIVE WAFER TARGET DETECTION IN TWO DIRECTIONS

RELATED APPLICATION

This application is a divisional of U.S. patent application Ser. No. 08/730,787 filed Oct. 16, 1996, which is herein incorporated by reference.

FIELD OF THE INVENTION

The present invention relates generally to alignment of a mask and wafer, and more specifically to an alignment system and method used in a photolithographic production tool.

BACKGROUND OF THE INVENTION

The manufacture of semiconductor devices is primarily accomplished with photolithographic techniques. During the manufacturing process, multiple layers of a circuit pattern are built up on a semiconductor wafer. This is accomplished by projecting an image on a mask or reticle containing the circuit pattern onto a wafer coated with a photosensitive resist. Feature sizes imaged onto the semiconductor wafer are typically in the range of 0.5 microns or smaller. Due to the extremely small feature sizes and the requirement to expose multiple layers as part of the manufacturing process, the use of an alignment system to align the mask image on the semiconductor wafer is required. Often, the alignment accuracies necessary are in the range of 0.1 microns or less. One such alignment system is disclosed in U.S. Pat. No. 4,697,087 entitled "Reverse Dark Field Alignment System For Scanning Lithographic Aligner" issued to Frederick Y. Yu on Sep. 29, 1987, which is herein incorporated by reference. Therein disclosed is an alignment system wherein a wafer having a wafer target thereon, and a mask having a mask target thereon, are aligned with respect to each other. In the manufacture of semiconductor wafers, processing variables such as wafer characteristics, number, thickness, and type of surface layers, often makes alignment difficult. The variation in an alignment signal is a function of these processing variables and is referred to as process sensitivity. This process sensitivity often complicates the ability of an alignment system to accurately obtain the position of alignment marks placed on a wafer. Therefore, there is a need for an alignment system that is relatively process insensitive or that can obtain accurate positioning information irrespective of process variations.

SUMMARY OF THE INVENTION

The present invention is an alignment system and method that greatly improves positioning accuracy irrespective of process variables. Optics are used to project a predetermined pattern of electromagnetic radiation from an illumination source onto a semiconductor wafer having alignment marks thereon. The alignment marks are scanned past the predetermined pattern of illumination and reflected or scattered from the edges of the alignment marks. A detector collects the reflected or scattered light, converting the electromagnetic radiation into electrical signals. A like edge selector matches like edges of a pair or more of alignment marks. A signal analyzer analyses the signal from the matched like edges in order to obtain positioning and alignment information. The positioning and alignment information is used to accurately align the circuit features sequentially exposed on the semiconductor wafer for forming a circuit pattern. By like edges it is meant the first or leading edge of a first alignment mark being matched to a first or leading edge of a second, or more, alignment marks, and a second or trailing edge of the first alignment mark being matched to a second or trailing edge of the second, or more, alignment marks that are detected in a scanning operation. In another embodiment of the present invention, a forward detector and a rearward detector are used in conjunction with the like edge selector to selectively detect scattered or reflected electromagnetic radiation in a forward direction or a rearward direction relative to a scanning direction.

Accordingly, it is an object of the present invention to improve alignment accuracy between a wafer and mask in a photolithography system.

It is an advantage of the present invention that it is relatively insensitive to process variations.

It is an advantage of the present invention that it provides improved detection of wafer marks or targets, and is adaptable to different substrates.

It is a feature of the present invention that sets of like edges are detected and matched to obtain alignment information.

It is a feature of the present invention that a forward detector and a rearward detector are used in selecting sets of like edges having a dominant or relatively strong signal.

These and other objects, advantages, and features will become readily apparent in view of the following detailed description.

BRIEF DESCRIPTION OF THE DRAWINGS

FIGS. 3a–3d graphically illustrates the signal analysis of the present invention.

FIG. 4 schematically illustrates another embodiment of an alignment pattern.

FIG. 4a schematically illustrates another embodiment of an alignment pattern.

FIGS. 6a–6f graphically illustrate the signal analysis of the embodiment of the present invention illustrated in FIG. 5.

DETAILED DESCRIPTION OF THE PREFERRED EMBODIMENTS

Figure 1:
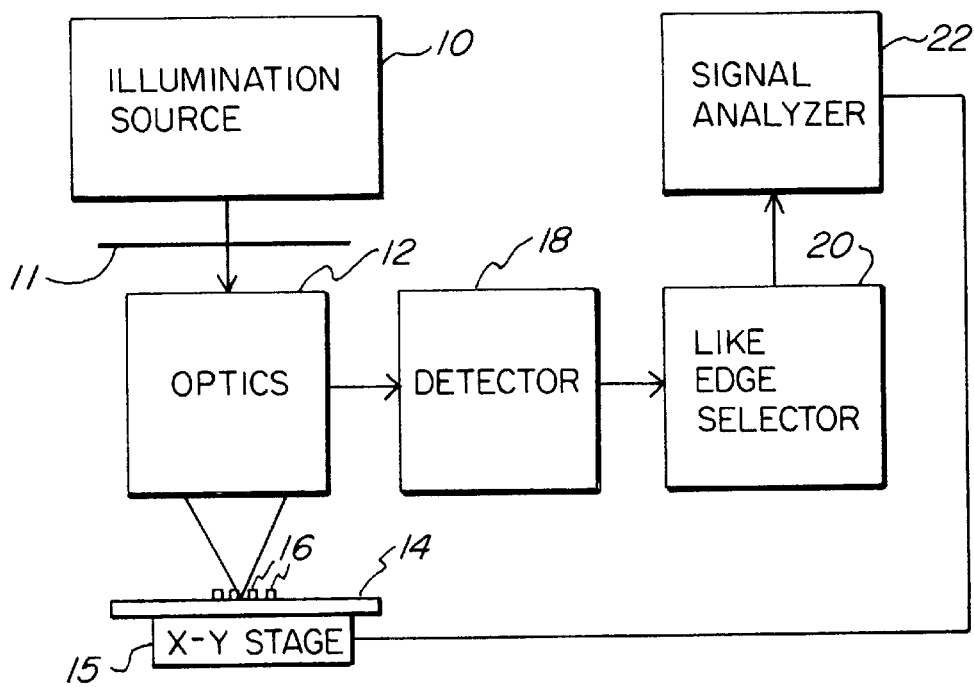
FIG. 1 is a block diagram generally illustrating the present invention.

FIG. 1 is a block diagram generally illustrating the present invention. An alignment system similar to that of the present invention is disclosed in U.S. Pat. No. 5,477,057 entitled "Off Axis Alignment System For Scanning Photolithography" issuing to David Angeley, et al, on Dec. 19, 1995, which is herein incorporated by reference. An illumination source 10 projects electromagnetic radiation through reticle 11 and optics 12 onto a semiconductor wafer 14. Semiconductor wafer 14 has a plurality of wafer alignment marks 16 formed thereon. The wafer alignment marks 16 are generally lines formed by raised portions separated by a gap. However, trenches are also often used for alignment marks and may be used in place of raised portions. The wafer alignment marks 16 may be made by any conventional wafer fabrication process, and may be a grating. The wafer 14 is placed on an X-Y stage 15. The X-Y stage 15 permits the wafer 14 to be scanned in the direction indicated by arrow 17 with the electromagnetic radiation from illumination source 10. The electromagnetic radiation is imaged to form a predetermined illumination pattern, not shown. The predetermined illumination pattern is generally an X. However, any illumination pattern may be used that provides a detectable signal upon encountering a wafer alignment mark 16. The predetermined illumination pattern is created by a portion of a reticle or mask 11 through which the electromagnetic radiation from illumination source 10 passes. Electromagnetic radiation reflected or scattered from the surface of wafer 14 and the wafer alignment marks 16 is collected by optics 12 and directed to a detector 18. Detector 18 may be any detector capable of converting electromagnetic radiation into an electric signal. The detector 18 may also be positioned to collect reflected or scattered electromagnetic radiation from either side of the wafer alignment marks 16. Multiple detectors 18 may be used positioned at different locations. Like edge selector 20 is coupled to the detector 18. Like edge selector 20 selects like edges of pairs or sets of wafer alignment marks 16. Signals representative of the like edges selected by like edge selector 20 are analyzed by signal analyzer 22. The signal analyzer 22 uses any conventional signal analyzing technique to determine the location of like edges of the wafer alignment marks 16. From this information, the signal analyzer 22 determines the position of the wafer 14 and alignment of the wafer 14 and reticle 11. The wafer stage 15 is moved accordingly to achieve or maintain alignment.

Figure 2:
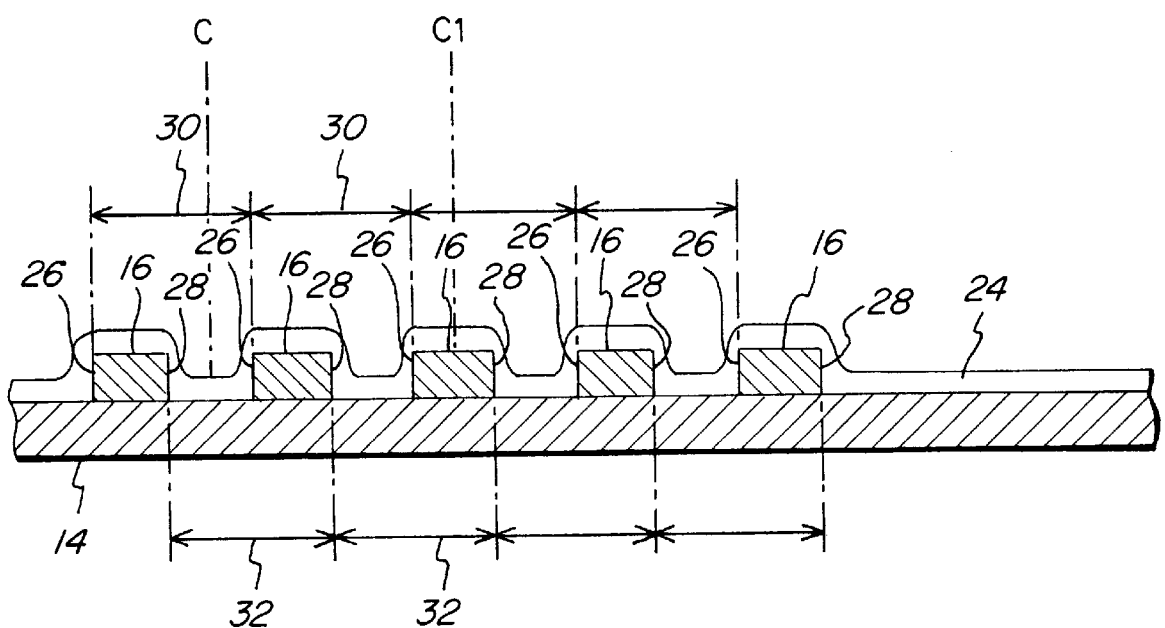
FIG. 2 is a partial cross section of a wafer having alignment marks and a process coating thereon.

FIG. 2 is a portion of wafer 14 more clearly showing the wafer alignment marks 16 thereon. Wafer 14 and wafer alignment marks 16 are covered with a process coating 24. Only one process coating 24 is illustrated. However, typically, many process coatings are used in the manufacture of semiconductors. Each wafer alignment mark 16 has a first, leading, or left edge 26 and a second, trailing, or right edge 28. Left edges 26 are like edges, and form a set of like edges. Right edges 28 are also like edges, and form a set of like edges. By like edge it is meant an edge of an alignment mark that is of similar or the same configuration or position as another edge on another alignment mark. Accordingly, between left like edges 26 a pitch or distance 30 is formed. Similarly, between right like edges 28 a pitch or distance 32 is formed. The apparent width of the wafer alignment marks 16 will vary as a function of the process coating 24. Accordingly, the detected line width associated with a single wafer alignment mark 16 will increase with the number of process coatings 24 sequentially placed on the wafer alignment marks 16 and the wafer 14 surface. As a result, the apparent or detected line width, between edges 26 and 28, will vary dependent upon processing variables, making it difficult to accurately ascertain the center of a wafer alignment mark 16 and to perform signal analysis on the signals generated from detection of the reflected or scattered electromagnetic radiation. In the present invention, by pairing like edges of pairs of wafer alignment marks 16, the detection and analysis of the generated signals is independent of the apparent line width. Accordingly, the detection of the wafer alignment marks 16 is independent or insensitive to the apparent width of the wafer alignment marks 16. Therefore, the alignment system of the present invention is able to accurately determine the center of an alignment mark independent of the apparent line width of the alignment mark, which varies depending on processing variables. As indicated in FIG. 2 the detected center is dependent on the grouping of the alignment marks 16. For example, if the center C of two alignment marks 16 is to be determined, a pair of like edges 26 and 28 from only two alignment marks 16 are utilized. If the center C1 of the five alignment marks 16 is to be determined, a set of like edges 26 and 28 from the five alignment marks 16 are utilized.

FIGS. 3a–3d illustrate the operation of the present invention, including the detection and analysis of a signal representative of the wafer alignment marks 16 illustrated in FIGS. 1 and 2. FIG. 3a graphically represents the wafer surface 14' and the wafer alignment mark surface 16'. The wafer alignment mark surface 16' has a left edge 26' and a right edge 28'. An illumination pattern having an illumination profile illustrated by wave form 34 scans from left to right, in the direction of arrow 17', across the wafer surface 14' and the wafer alignment mark surface 16'. Typically, but not necessarily, the wafer alignment marks and illumination pattern are angled forming a chevron. The predetermined illumination pattern represented by wave form 34 is reflected or scattered from left edge 26' and collected by detector 18, illustrated in FIG. 1, to form a signal representative by wave form 36 in FIG. 3b. Similarly, wave form 38 represents the signal corresponding to the electromagnetic radiation reflected or scattered from right edge 28'. Wave forms 36', 38', and 36", in FIG. 3b, similarly represent the electromagnetic radiation reflected or scattered from corresponding left edges 26' and right edge 28'. Wave forms 36, 38, 36', 38', and 36" are all slightly different as a result of the process variables. Wave forms 36 and 36' represent a pair of like edges, as does wave forms 38 and 38'. FIG. 3c represents a wave form 40 illustrative of a correlator function. A correlator is essentially used to detect weak signals in noise by performing an electronic operation approximating the computation of a correlation function. The correlator wave form 40 has a period of approximately the distance between the pairs of like edges 26' or 28'. Wave forms 42 and 42', illustrated in FIG. 3d, represent the partial output resulting from applying the correlator function, represented by wave form 40, to the detector signals represented by wave forms 38 and 36'. The correlator output wave form 42 and 42', upon crossing a zero reference 44, identify the locations 46 and 46' representing the center of detected edges associated with respective like edges 26' and 28' of a pair of wafer marks 16'. Upon detection of pairs of like edges 26' and 28', an average is taken which constitutes the detected center of the distance between wafer alignment marks 16'. Accordingly, position and alignment information is obtained, for example the centers C or C1 illustrated in FIG. 2. It has experimentally been determined that the pairing of like edges according to the teachings of the present invention has reduced level mean shift variation by as much as fifty (50%) percent.

In general, the correlator is used to determine maximum signal areas. The correlator function contains both positive and negative values and is an approximation of the derivative of an estimate of the expected signal from the edges of the alignment mark mathematically slid, multiplied and integrated along the length of the detected or captured signal. Areas which have a signal significantly above zero are detected by the function rising, due to the use of a positive correlation, and then falling, due to the negative correlation. The signal position is then determined at the point the function crosses zero, between high and low. The signals are analyzed for their slope with the zero reference. Like edges are determined by having a prior knowledge of the line edge expected positions and providing a correlator with the same spacing or pitch. With the predetermined spacing the correlator, looking at N line edges will show signal strength N times the actual because of the number of lines being detected simultaneously. While a correlation function signal processing technique has been described, any other suitable or equivalent signal processing technique may used, as long as the required signal detection is obtained.

FIG. 4 illustrates another embodiment of a pattern of wafer alignment marks which may be used with the present invention. Wafer 14 has alignment marks 116, 116', and 116" thereon. The width of the wafer alignment marks 116, 116', and 116" are different, and in this embodiment are increasing in width from one end to the other. The width of alignment mark 116' is twice that of alignment mark 116, and the width of alignment mark 116" is three times that of alignment mark 116. Therefore, the width increases in integral multiples of the initial width at one end. Alignment mark 116 has a first, leading, or left edge 126, and a second, trailing, or right edge 128. Similarly, alignment mark 116' has a first, leading, or left edge 126', and a second, trailing, or right edge 128'. Wafer alignment mark 116" has a first, leading, or left edge 126" and a second, trailing, or right edge 128". In this embodiment, a first set of like edges are identified by 126, 126', and 126". A second set of like edges are identified by 128, 128', and 128". A pitch or distance 130 is formed between adjacent like edges 126 and 126'. Pitch or distance 130' is formed between like edges 126' and 126". Pitch or distance 130" is formed between like edge 126" and a like edge 126 of a second set of substantially identical wafer alignment marks. Accordingly, wafer alignment marks 116, 116' and 116" form a period P. Pitch or distance 132 is formed between like edges 128 and 128'. Pitch or distance 132' is formed between like edges 128' and 128". Pitch or distance 132" is formed between like edges 128' and 128 of a second set of nearly identical alignment marks. Accordingly, FIG. 4 is illustrative of a set of different alignment marks which may be used having like edges. The present invention should not be construed to be limited to the various forms of wafer marks illustrated. The different forms of wafer marks need only have like edges which may be matched in order to obtain position and alignment information. For example, FIG. 4a illustrates wafer 14 having a different set of alignment marks 316, 316' and 316". The two alignment marks 316 have equal widths, as do the two alignment marks 316'. The width of alignment mark 316" is larger than the width of alignment marks 316', which is larger than the width of alignment marks 316. The set of like edges 326, 326', 326" and the set of like edges 328, 328', 328" are used to obtain the location of the center C2 in a similar way as described for the embodiments.

Figure 5:
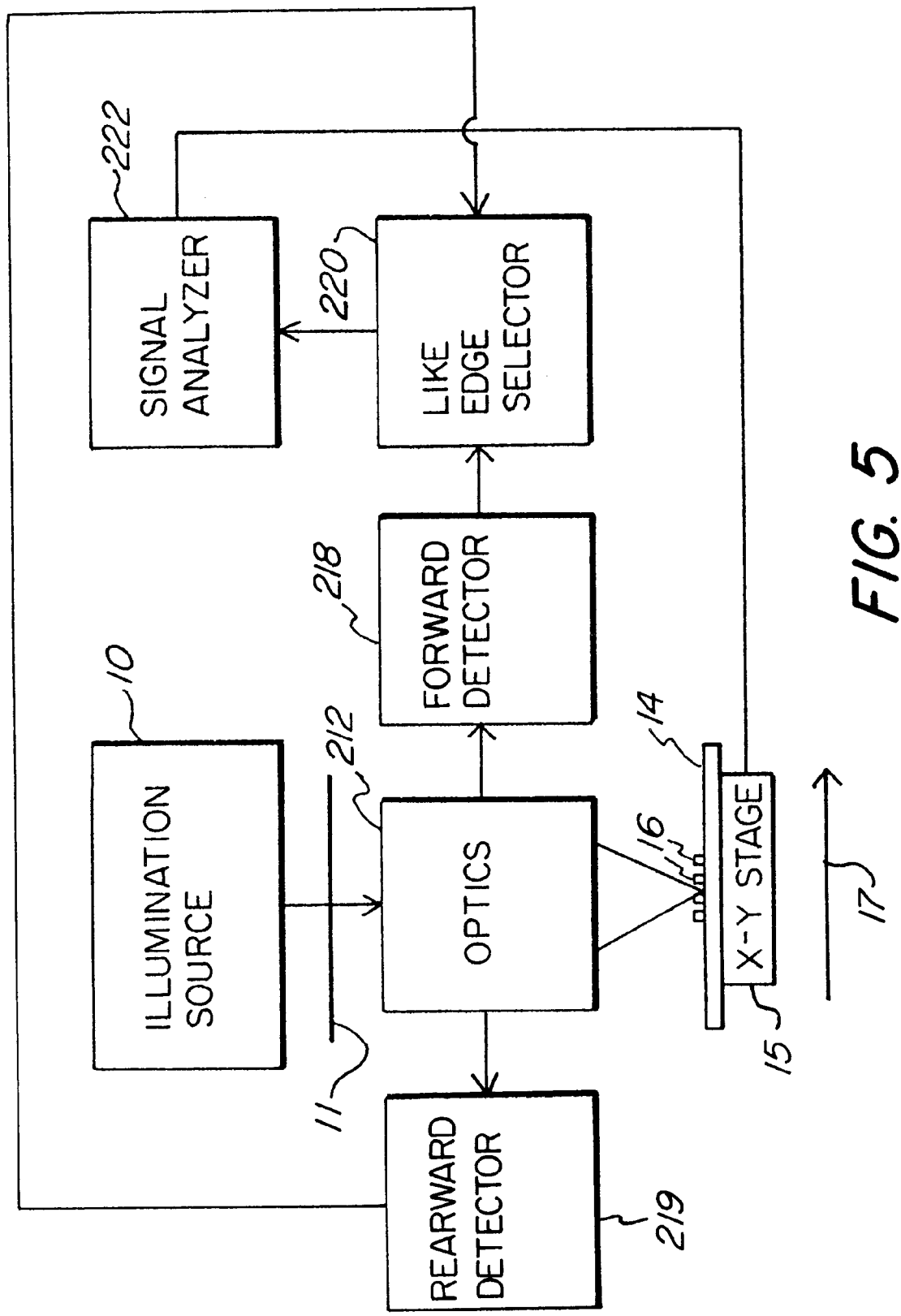
FIG. 5 is a block diagram generally illustrating another embodiment of the present invention.

FIG. 5 is a block diagram generally illustrating another embodiment of the present invention. FIG. 5 is similar to the embodiment illustrated in FIG. 1. However, FIG. 5 incorporates multiple detectors for detecting different portions of the electromagnetic radiation scattered or reflected from the wafer alignment marks 16 on wafer 14. Similar to FIG. 1, an illumination source 10 is used to image a reticle 11 onto wafer 14 having wafer alignment marks 16 thereon. A stage 15 holding the wafer is moved or scanned in the direction of arrow 17. As a result an illumination pattern is scanned across the alignment marks 16. Electromagnetic radiation from the illumination pattern is reflected or scattered from the alignment marks 16, in particular the edges thereof, and collected by optics 212. Reflected or scattered electromagnetic radiation in a direction the same as the scan direction or a forward direction is collected by forward detector 218, and reflected or scattered electromagnetic radiation in a direction opposite to the scan direction or rearward direction is collected by rearward detector 219. A like edge selector 220 is used to detect the signals representative of like edges. Signal analyzer 222 analyzes the signals and calculates a position or location dependent thereon.

FIGS. 6a–6f more fully illustrate the detection and analysis of signals used in the embodiment illustrated in FIG. 5. FIG. 6a illustrates a substrate or a wafer 14' having a plurality of wafer alignment marks 16' thereon. The wafer alignment marks 16' form a target having a linear dimension T. The linear dimension T may also be the period of a repetitive pattern of alignment marks. The dimension T has a center C. An electromagnetic illumination pattern having an illumination profile illustrated by wave form 34 scans from left to right in the direction of arrow 17' across the wafer surface 14. Electromagnetic radiation is reflected or scattered from the edges 26' and 28'. Edges 26' and 28' are termed complementary because one of each is used in a single wafer alignment mark 16'. The electromagnetic radiation is reflected or scattered in a forward direction represented by arrow 250 and in a rearward direction represented by arrow 252. The forward detector 218, illustrated in FIG. 5, is positioned to collect the reflected or scattered electromagnetic illumination represented by arrows 250, and the rearward detector 219 is positioned to collect the scattered or reflected electromagnetic radiation represented by arrows 252. It has been discovered that on some substrates, that either the forward reflected or scattered electromagnetic radiation or the rearward reflected or scattered electromagnetic radiation will dominate or provide a strong signal for a respective set of like edges 26' or 28'. For example, FIG. 6b illustrates the forward detector output for a particular substrate having a relatively strong signal representative of electromagnetic radiation reflected or scattered and collected by the forward detector 218, illustrated in FIG. 5, for the left like edge set 26'. This is illustrated by a relatively high amplitude for the left edge signal wave form 236 and 236', representative of the electromagnetic radiation collected by the forward detector 218, illustrated in FIG. 5. The corresponding rearward reflected or scattered electromagnetic radiation illustrated by arrow 252, for like edge set 26' is less strong, as illustrated by the low amplitude of wave forms 237 and 237' in FIG. 6c. Similarly, electromagnetic radiation reflected or scattered from the right complementary like edge set 28' exhibits a relationship between the forward scattered or reflected electromagnetic radiation, represented by arrows 250', and the rearward reflected or scattered electromagnetic radiation, represented by arrows 252', in that the forward scatter or reflected electromagnetic radiation collected by the forward detector 218, illustrated in FIG. 5, results in a weaker signal illustrated by the low amplitude of wave forms 238 and 238', in FIG. 6b. The corresponding rearward reflected or scattered electromagnetic radiation, illustrated by arrows 252', from the like edge set 28' is stronger as illustrated by the relatively large amplitude of wave forms 239 and 239', illustrated in FIG. 6c. While some substrates may provide uniformly strong signals that may not provide a clear relationship between the forward reflected or scattered electromagnetic radiation and the rearward reflected or scattered electromagnetic radiation, many substrates do. For many of the substrates that have been investigated, for example, classes of layers on substrates used in semiconductor manufacturing known as contact layers, metal layers, Via layers, poly layers, and oxide layers, once a relatively strong signal is obtained, either in a forward or a rearward reflected or scattered direction for a like edge set the complimentary other like edge set generally exhibits a stronger signal in the other direction. For example, as illustrated in FIGS. 6a–6c, since the like edge set 26' results in a relatively strong forward reflecting or scattering electromagnetic radiation, the complimentary like edge set 28' generates a relatively strong rearwardly reflecting or scattering electromagnetic radiation. Depending on the substrate, it has been discovered that either the forward or rearward reflected or scattered electromagnetic illumination will dominate for a particular like edge set which generally results in an opposite dominant reflected or scattered electromagnetic radiation for the complimentary like edge set. As a result, the correlator, illustrated in FIG. 6d, used to detect a signal is matched to like edge sets and is used to determine the dominant or stronger signal. Accordingly, as illustrated in FIGS. 6b–6d, the correlator, represented by wave form 240, searches for the expected relatively strong signal represented by wave forms 239 and 239', providing an output wave form 242', in which the zero reference 244 identifies a center location 246' between the wave forms 239 and 239' representative of the like edge pair or set 28'. Similarly, the correlator wave form 240 may be used to detect the relatively strong signals 236 and 236' associated with the like edge pair or set 26', resulting in a correlator output wave form 242, in which the zero reference 244 is used to obtain a center location 246 between the wave forms 236 and 236' representative of the like edge pair or set 26'. The detected locations 246 and 246' are averaged to establish a determined central location 248 illustrated in FIG. 6f, which is the detected center or location of the center C of the target formed by wafer marks 16'.

Accordingly, the present invention according to the above embodiment has resulted in the quite unexpected result of increasing the accuracy of the detection of wafer marks or targets irrespective of substrate, class or type of wafer mark or target. It should be appreciated that due to the multiple processing steps in semiconductor fabrication, often the signals obtained from the wafer targets or marks are relatively weak and often very hard to detect. The present invention provides an advantage in that it selects the stronger of relatively weak signals and is able to detect them through large amounts of noise to ascertain the location or center of a wafer target that may otherwise be undetectable or uncertain.

Additionally, it should readily be appreciated that the present invention, by matching like edges, provides more accurate and relatively process insensitive position and alignment information which is used to more accurately align a reticle or mask and a wafer during sequential semiconductor manufacturing processing steps. Therefore, the art of semiconductor device manufacturing is advanced supporting the ever decreasing line width or feature size requirements of smaller, more densely populated semiconductor devices, thereby contributing to production of more efficient and faster electronic circuits.

Additionally, although the preferred embodiment has been illustrated and described, it will be obvious to those skilled in the art that various modifications may be made without departing from the spirit and scope of this invention.

What is claimed is:

1. A photolithographic alignment system comprising:
   an illumination source;
   optics, said optics positioned to receive electromagnetic radiation from said illumination source and illuminate a wafer having alignment marks thereon, each of the alignment marks having a first and a second edge;
   a stage, said stage movable in a scan direction;
   a forward detector positioned to receive electromagnetic radiation reflected from the alignment marks in the scan direction;
   a rearward detector positioned to receive electromagnetic radiation reflected from the alignment marks in a direction away from the scan direction;
   a like edge selector, said like edge selector selecting signals from said forward detector and said rearward detector representative of a set of first edges and a set of second edges; and
   a signal analyzer, said signal analyzer calculating a location of the set of first edges and set of second edges from the signals,
   whereby alignment of the wafer is obtained.

2. A photolithographic alignment system as in claim 1 wherein:
   said like edge selector determines which of said forward and rearward detectors has dominant signals relative to the set of first edges and the set of second edges.

3. A photolithographic alignment system as in claim 1 wherein:
   said signal analyzer includes a correlator.

4. A photolithographic alignment system as in claim 2 wherein:
   said correlator is associated with the dominant signals from said forward and rearward detectors.

5. A method of aligning a wafer comprising the steps of:
   projecting electromagnetic radiation onto a wafer, the wafer having spaced alignment marks thereon, the alignment marks having complementary first and second sets of like edges;
   detecting electromagnetic radiation reflected from the alignment marks in a first direction;
   detecting electromagnetic radiation reflected from the alignment marks in a second direction;
   selecting first dominant signals representative of the first set of like edges from the electromagnetic radiation reflected from the alignment marks in the first direction;
   selecting second dominant signals representative of the second set of like edges from the electromagnetic radiation reflected from the alignment marks in the second direction; and
   calculating a position of the wafer alignment marks based on the first and second dominant signals,
   whereby the wafer is accurately aligned.

6. A method of aligning a wafer as in claim 5 further comprising the step of:
   scanning the projected electromagnetic radiation across the wafer in a scan direction.

7. A method of aligning a wafer as in claim 6 wherein:
   the first direction is in the scan direction; and
   the second direction is away from the can direction.

8. A method of aligning a wafer as in claim 7 further comprising the step of:
   correlating the first and second dominant signals with a correlator function obtaining a first center location for the first set of like edges and a second center location for the second set of like edges.

9. A method of aligning a wafer as in claim 8 further comprising the step of:
   averaging the first and second center locations obtaining a determined central location.

10. An alignment system for use in photolithography comprising:
    an illumination source providing electromagnetic radiation;
    optic means, positioned to receive the electromagnetic radiation from said illumination source, for illuminating alignment marks on a substrate, said alignment marks having a first set of like edges and a second set of like edges;

forward detector means, positioned to receive the electromagnetic radiation from the alignment marks, for detecting the first and second set of like edges in a forward direction;

rearward detector means, positioned to receive the electromagnetic radiation from the alignment marks, for detecting the first and second set of like edges in a rearward direction;

like edge selector means, coupled to said forward and rearward detector means, for selecting signals from said forward detector means and said rearward detector means representative of the first set of like edges and the second set of like edges; and signal analyzer means, coupled to said like edge selector means, for calculating the location of the alignment marks.

11. An alignment system for use in photolithography as in claim 10 further comprising:

stage means, adjacent said optic means, for holding a substrate and scanning in the forward direction.

12. An alignment system for use in photolithography as in claim 10 wherein:

said signal analyzer means calculates substantially a center of the alignment marks based on the location of the first set of like edges and the second set of like edges.

* * * * *